(12) United States Patent
Conrads et al.

(10) Patent No.: US 10,129,986 B2
(45) Date of Patent: Nov. 13, 2018

(54) PRINTED CIRCUIT BOARD AND PRINTED CIRCUIT BOARD ARRANGEMENT

(71) Applicant: KONINKLIJKE PHILIPS N.V., Eindhoven (NL)

(72) Inventors: Ralf Gordon Conrads, Eindhoven (NL); Hendrik Huisman, Eindhoven (NL); Carsten Deppe, Eindhoven (NL); Xi Gu, Eindhoven (NL); Gero Heusler, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 35 days.

(21) Appl. No.: 15/506,035

(22) PCT Filed: Sep. 24, 2015

(86) PCT No.: PCT/EP2015/072033
§ 371 (c)(1),
(2) Date: Feb. 23, 2017

(87) PCT Pub. No.: WO2016/046339
PCT Pub. Date: Mar. 31, 2016

(65) Prior Publication Data
US 2018/0220536 A1    Aug. 2, 2018

(30) Foreign Application Priority Data
Sep. 24, 2014 (EP) ..................................... 14186224

(51) Int. Cl.
*H05K 1/14* (2006.01)
*H05K 1/11* (2006.01)
(Continued)

(52) U.S. Cl.
CPC ............. *H05K 3/366* (2013.01); *H05K 1/111* (2013.01); *H05K 1/117* (2013.01); *H05K 1/141* (2013.01);
(Continued)

(58) Field of Classification Search
CPC ........ H05K 1/117; H05K 1/111; H05K 1/141; H05K 2203/049
See application file for complete search history.

(56) References Cited

U.S. PATENT DOCUMENTS 3,281,627 A   10/1966   Fetterolf et al.
5,313,096 A    5/1994   Eide
(Continued)

FOREIGN PATENT DOCUMENTS

DE        4136355 A1    5/1993
DE   102004063135 A1    7/2006

OTHER PUBLICATIONS

Flexible Circuit Design Guide, Fourth Edition, Teledyne Electronic Technologies, Jan. 2000.
(Continued)

*Primary Examiner* — Hoa C Nguyen

(57) ABSTRACT

The invention describes a printed circuit board with a top side and a bottom side, the printed circuit board comprising at least two electrically conductive layers (112, 114, 116, 212, 214, 312, 314, 212*i*, 214*i*, 212*j*, 214*j*) for transmitting electrical current and at least one electrically insulating layer (102, 104, 106, 108, 202, 204, 302, 304, 202*i*, 204*i*, 202*j*, 204*j*) comprising electrically insulating material, wherein the electrically conductive layers (112, 114, 116, 212, 214, 312, 314, 212*i*, 214*i*, 212*j*, 214*j*) and the electrically insulating layer (102, 104, 106, 108, 202, 204, 302, 304, 202*i*, 204*i*, 202*j*, 204*j*) are arranged in an alternating assembly such that the two electrically conductive layers (112, 114,
(Continued)

116, 212, 214, 312, 314, 212i, 214i, 212j, 214j) are electrically insulated with respect to each other by means of the electrically insulating layer (102, 104, 106, 108, 202, 204, 302, 304, 202i, 204i, 202j, 204j), wherein each of the electrically conductive layers (112, 114, 116, 212, 214, 312, 314, 212i, 214i, 212j, 214j) is adapted to be coupled to a bond wire (460a, 460b) independently from the other electrically conductive layer (112, 114, 116, 212, 214, 312, 314, 212i, 214i, 212j, 214j) at a side surface of the printed circuit board being inclined to the top side and the bottom side of the printed circuit board. The invention further describes a corresponding method of fabricating the printed circuit board. The invention further describes a printed circuit board arrangement comprising the printed circuit board and a corresponding method of fabricating the printed circuit board arrangement.

14 Claims, 8 Drawing Sheets

(51) Int. Cl.
  *H05K 3/36* (2006.01)
  *H05K 3/34* (2006.01)
(52) U.S. Cl.
  CPC ..... *H05K 3/3405* (2013.01); *H05K 2201/046* (2013.01); *H05K 2203/049* (2013.01)

(56) References Cited

U.S. PATENT DOCUMENTS

| | | | |
|---|---|---|---|
| 6,188,126 B1* | 2/2001 | Pedersen | H01L 23/3737 257/685 |
| 7,071,574 B1* | 7/2006 | Nojiri | H01L 24/49 257/723 |
| 2002/0012239 A1 | 1/2002 | Dent | |
| 2003/0024731 A1* | 2/2003 | Nordal | H01L 24/24 174/250 |
| 2004/0155326 A1* | 8/2004 | Kanbayashi | H01L 23/49816 257/686 |
| 2004/0157410 A1* | 8/2004 | Yamaguchi | H01L 23/49805 438/460 |
| 2006/0033517 A1 | 2/2006 | Khandros et al. | |
| 2007/0013083 A1* | 1/2007 | Kikuchi | H01L 21/4853 257/786 |
| 2007/0069397 A1* | 3/2007 | Van Lerberghe | H01F 17/0033 257/784 |
| 2008/0303131 A1* | 12/2008 | McElrea | H01L 24/24 257/686 |
| 2009/0065948 A1* | 3/2009 | Wang | H01L 24/49 257/777 |
| 2009/0096110 A1* | 4/2009 | Sagara | H01L 21/6835 257/777 |
| 2010/0062621 A1 | 3/2010 | Bruennert | |
| 2010/0117241 A1* | 5/2010 | Denda | H01L 24/24 257/773 |
| 2010/0258929 A1* | 10/2010 | Kim | H01L 24/24 257/686 |
| 2010/0294546 A1 | 11/2010 | Nickel et al. | |
| 2011/0006381 A1* | 1/2011 | Feiertag | B81B 7/007 257/416 |
| 2012/0075822 A1 | 3/2012 | Habibi et al. | |

OTHER PUBLICATIONS

Krammer et al "Investigating Copper Wire Bonding Technology in Chip on Board Applications" 36th Int. Spring Seminear on Electronics Technology. 2013.

J. Falk J. Hauke G. Kyska, (1994), "Wire-bonding on Printed Circuit Boards", Circuit World, vol. 20 Iss 2 pp. 8-13.

\* cited by examiner

PRINTED CIRCUIT BOARD AND PRINTED CIRCUIT BOARD ARRANGEMENT

CROSS-REFERENCE TO PRIOR APPLICATIONS

This application is the U.S. National Phase application under 35 U.S.C. § 371 of International Application No. PCT/EP2015/072033, filed on Sep. 24, 2015, which claims the benefit of EP Patent Application No. EP 14186224.3, filed on Sep. 24, 2014. These applications are hereby incorporated by reference herein.

FIELD OF THE INVENTION

The invention relates to a printed circuit board arrangement comprising the printed circuit board and a corresponding method of fabricating the printed circuit board arrangement.

BACKGROUND OF THE INVENTION

Placing two or more electrical circuit boards perpendicular to each other is an arrangement which may be attractive in order to save space. Interconnection of electrical circuit boards placed adjacent but perpendicular to each other can easily be done by means of flex foils in a cost effective way.

U.S. Pat. No. 3,281,627 discloses an insulative panel having a plurality of signal conductors supported on a side of the panel, the signal conductors terminating adjacent an edge of the panel. A first set of holes is formed in the edge surface of the panel, each hole of the first set corresponding to one of the signal conductors. A second set of holes is formed in the insulative panel at a distance from the edge surface, each hole of the second set intersecting a signal conductor and the corresponding hole of the first set. A coating of conductive material is deposited on the walls of each hole. The coated holes of the first set serve as female connectors which are adapted to receive male connector pins. US 2010/0062621 A1 discloses a horizontal dual in-line memory modules. The memory module includes a circuit board, a plurality of memory chips attached to a top surface of the circuit board, and a plurality of courrector contacts disposed under a back surface of the circuit board and extending away from the memory chips, the connector contacts being electrically coupled to the memory chips, the back surface opposite the top surface of the circuit board.

DE 10 2004 063135A1 discloses a printed circuit boards which are interconnected by means of flexible strip conductors or jumpers. The jumpers are soldered to the circuit boards in one step along with other SMD components and other components in a reflow soldering furnace. Metal-plated lateral openings are mounted in the face of the circuit board, which is usually provided with several inner layers as well as inner strip conductors and outer strip conductors. Terminal pins or connecting wires of a jumper that are plugged into said openings can be soldered to the circuit board together with other components in a reflow soldering furnace after introducing or applying solder paste.

SUMMARY OF THE INVENTION

Flex foils may limit the flexibility of such circuit arrangements. Also number of contacts is usually limited to maximal two layers of tracks.

It's thus an object of the present invention to provide a printed circuit board arrangement which enables a more flexible connection of printed circuit boards around corners and a corresponding method of fabricating such printed circuit board arrangements.

The printed circuit board comprises a top side and a bottom side. The printed circuit board further comprises at least two electrically conductive layers for transmitting electrical current and at least one electrically insulating layer comprising electrically insulating material. The electrically conductive layers and the electrically insulating layer are arranged in an alternating assembly such that the two electrically conductive layers are electrically insulated with respect to each other by means of the electrically insulating layer. Each of the electrically conductive layers is adapted to be coupled to a bond wire independently from the other electrically conductive layer at a side surface of the printed circuit board. The side surface is inclined with respect to the top side and preferably the bottom side of the printed circuit board. The angle of inclination with respect to the top side needs not necessarily to be the same as with respect to the bottom side. It may, for example, be possible to tapper the layer at the top side only.

The electrically insulating material may for example comprise ceramic material or organic material like plastic. The electrical current may comprise electrical signals for transmitting information or electrical power in order to drive an electrical device. The printed circuit board may comprise two three, four or more electrically conductive layers as well as one, two, three, four or more electrically insulating layers. The stack of electrically conductive layers and electrically insulating layers may comprise two electrically conductive layers at the bottom and top side of the printed circuit board, an electrically conductive layer at the bottom side and an electrically insulating layer at the top side or vice versa or two electrically insulating layers at the bottom and the top side of the printed circuit board. The bottom side and the top side of the printed circuit board are the extended outer surfaces of the printed circuit board which may be placed on a carrier like a cooler or heat sink. The side surfaces of the printed circuit board are the surfaces which are inclined to the electrically conductive and the electrically insulating layers. The angle of inclination between the side surface and the top side may be in the range of 90° and 165°. Top surface means in this respect the side of the printed circuit board which is arranged to point away from the carrier on which the printed circuit board may be mounted.

The electrically conductive layers which are arranged parallel with respect to each other can be contacted independently by means of the bond wires. An electrical signal or electrical power which is transferred by means of the bond wires can be thus transmitted to a first conductive layer. A second conductive layer doesn't receive an electrical signal or electrical power or the second conductive layer may receive a different electrical signal which is essentially independent from the electrical signal received by the first conductive layer.

In alternative arrangement there may be two bond wires which are coupled to a common bond pad. Both bond wires transmit the same electrical current. The electrical current may be used to transmit electrical signals or power. A first bond wire connects a first electrically conductive layer and a second bond wire connects a second electrically conductive layer. Such an arrangement may be advantageous if electrical power has to be transferred. The electrically conductive layers may be used in this case to reduce the electrical resistance and corresponding ohmic losses. The electrically conductive layers may comprise two, three or more electrically conductive traces which can be connected independently by means of bond wires at the side surface of the printed circuit board. Different electrical currents may be transferred by means of the different electrically conductive layers within one electrically conductive layer.

One, two, three or more of the side surfaces may be used to contact electrically conductive layers and traces by means of bond wires.

The electrically conductive layers may have a thickness of at least 30 µm, preferably at least 50 µm and more preferably at least 60 µm. The thickness of the electrically conductive layers may enable a reliable connection to the electrically conductive layers at the side surfaces of the printed circuit board.

The thickness of the electrically insulating layer may also influence the capability of the printed circuit board to be electrically contacted at one or more side surface by means of bond wires. Especially organic material may be too soft such that the contacting surface of the electrically conductive layers at the one or more side surfaces of the printed circuit board may deform during the bonding process. The electrically insulating layer sandwiched between the electrically conductive layer may thus have a thickness of equal to or less than 200 µm, preferably of equal to or less than 150 µm and more preferably of equal to or less than 100 µm. The thickness of the insulating layers may in addition depend on the electrical characteristics of the electrical signals or electrical power which have to be transferred or transmitted by means of the electrically conductive layers or traces. The insulating property of the electrically insulating layer has to be sufficient in combination with the thickness of the electrically insulating layer to avoid short circuits.

At least one of the electrically conductive layers may comprise a thickening at the side of the printed circuit board such that each of the electrically conductive layers is adapted to be coupled to a bond wire independently from the other electrically conductive layers. Especially a thickening of an electrically conductive layer which is not sandwiched between two insulating layers may have the advantage that a contacting area at the side of the printed circuit board may be stabilized. Such thickening may, for example, be provided by means of electroplating. The electrically conductive layers may be thickened at one, two or more side surfaces of the printed circuit board. The electrically conductive layers may, for example, have a thickness of 35 µm but may be thickened at side surface to, for example, 50 µm. The thickening may, for example, be arranged as a kind of rim at one or more of the side surfaces of the printed circuit board. The thickened side surface may have a depth of 50 µm, 100 µm, 200 µm or even 500 µm or more. The depth may be adapted such that a multitude of printed circuit boards can be manufactured on one mother printed circuit board and separated and in subsequent process step. The depth of thickened side surface may thus depend on the separation process (dicing, stamping or the like).

The side surface of the printed circuit board may in one embodiment be perpendicular to the top side and the bottom side of the printed circuit board. The angle of inclination between the side surface and the top side is 90° in this case and in accordance with the standard arrangement of printed circuit boards. Thickening of the electrically conductive layers at the side surfaces of the printed circuit board may be especially advantageous in case of an angle of inclination of 90°.

At least one of the side surfaces of the printed circuit board may in another embodiment be inclined to the top side and the bottom side of the printed circuit board such that a contact area for coupling the bond wire is increased. The surfaces of the electrically conductive layers or paths at a side surface of the printed circuit board at an angle of inclination different than 90° is increased. It may thus be easier to contact the electrically conductive layers or paths at the side surface especially if the electrically conductive layers are relatively thin, for example, less than 40 µm. The thickness the electrically conductive layer may depend on the angle of inclination in combination with the thickness of the electrically insulating layer or layers between the electrically conductive layers. It may even be possible to contact electrically conductive layers at side surfaces with a thickness of 35 µm or even 17.5 µm by means of bond wires. The angle of inclination between the side surface and the top surface may be in a range of 105°-165°, preferably 120°-150°, most preferably 135°

At least parts of the electrically conductive layers may comprise a coating comprising gold for simplifying coupling of the bond wire. The electrically conductive layers and the electrically conductive traces may be prepared for wire bonding at the side surface of the printed circuit board by means of a bondable surface coating. The surface coating may depend on the bonding technology. A NiAu coating may be used for aluminium bond wires, a NiPdAu may be used for gold bond wires. Anyhow, in many cases the standard ENIG (Electroless nickel immersion gold) finish of the contacting surfaces of the electrically conductive layers or paths may be sufficient.

According to a first aspect a printed circuit board arrangement is provided. The printed circuit board arrangement comprises at least one printed circuit board as described above, a carrier and a contacting circuit board, wherein the printed circuit board is coupled to a first side of the carrier and the contacting circuit board is coupled to an adjacent second side of the carrier being inclined to the first side of the carrier, wherein at least one electrically conductive layer of the printed circuit board is coupled to a bond wire at the side surface of the printed circuit board, and wherein the bond wire provides a connection to an electrically conductive trace of the contacting circuit board for exchanging electrical current between the printed circuit board and the contacting circuit board. The printed circuit board enables printed circuit board arrangements on carriers which may be a heat sink or an active cooling device. The active cooling device may comprise a microchannel structure.

The heat sink or the active cooling device or more general the cooling device may be adapted such that a first cooling power is provided at a first side of the cooling device and second cooling power is provided at a second side of the cooling device. The cooling device may be arranged such that there are two, three or more sides of different cooling power. A heat sink may, for example, comprise cooling fins which are arranged to provide different cooling powers at different sides of the heat sink. An active cooling device may, for example, comprise a microchannel structure which is arranged in parallel to the first side. Water or any other suitable cooling liquid or more general fluid may be used to enable an effective cooling. The microchannel structure arranged parallel to and preferably near to the surface of the first side may enable a cooling of a first electrical heat source providing a heat density of, for example, 250 W/cm$^2$. The cooling power at the sides which are not parallel to the microchannel structure may be smaller because there may be less channels and the distance to the channels may be bigger. A second side of the active cooling device may thus enable only a cooling of a second electrical heat source providing a heat density of, for example, 5 W/cm$^2$. The first electrical heat source may, for example, be a light emitting structure on a printed circuit board comprising a laser arrangement (single laser, or laser array) or an LED arrangement. The second electrical heat source may, for example, be at least a part of the driver electronics arranged on a contacting circuit board needed to electrically drive the light emitting structure. The printed circuit board arrangement may thus enable a highly integrated arrangement of electrical devices and corresponding cooling. It may further be possible to provide independent channel or microchannel structures to the different sides of the cooling device in order to enable an independent control of the cooling power by means of the channel structures, kind of fluid or different flow rates.

The different sides of the carrier may thus be efficiently used in order to dissipate heat and cool the printed circuit board and the contacting circuit board. The contacting circuit board may comprise, for example one electrically insulating layer and one electrically conductive layer. The contacting circuit board may in an alternative approach be a multilayer printed circuit board with a multitude of electrically insulating layers and electrically conductive layers. The contacting circuit board may further be a printed circuit board as described above.

At least one electrically conductive layer of the printed circuit board may comprise electrically conductive paths being electrically insulated with respect to each other, wherein a first electrically conductive path of one of the electrically conductive layer is electrically coupled by means of a first bond wire to a first contact pad of a first conductive trace of the contacting circuit board, and wherein a second electrically conductive path of one of the electrically conductive layers is electrically coupled by means of a second bond wire to the first contact pad. The contact pad may be used to distribute the electrical current to different conductive paths. The electrically conductive paths may be comprised by one electrically conductive layer. The first electrically conductive path may be comprised by a first electrically conductive layer and the second electrically conductive path may be comprised by a second electrically conductive layer in an alternative approach if the first and the second electrically conductive layers comprise at least two independent conducting paths. Both approaches may be combined by contacting conductive paths of a first electrically conductive layer and conductive paths of a second electrically conductive layer. There may be a multitude of electrically conductive layers and paths. Not all electrically conductive layers may comprise independent electrically conductive paths. The contacting circuit board may comprise a multitude of different electrically conductive traces and corresponding contact pads.

The first side of the carrier and the second side of the carrier may be arranged perpendicular to each other. It may be advantageous to arrange the printed circuit board and the contacting circuit board such that the side surface for coupling the electrically conductive layers and the electrically conductive traces are at the same level. The side surface of the printed circuit board and the surface of the contacting circuit board build in this case an area which is essentially flat. Coupling the electrically conductive layers at the side surface and the contacting circuit board may in this case be simplified. The contacting points of the bond wire or bond wires are placed in one plane.

The printed circuit board may in one embodiment of the printed circuit board arrangement be a first printed circuit board and the contacting circuit board be a second printed circuit board as described above. At least one electrically conductive layer of the first printed circuit board is coupled to a bond wire at a first side surface of the first printed circuit board. The bond wire provides an electrically conductive connection to a first conductive trace. The first conductive trace is arranged as a third electrically conductive layer of the second printed circuit board. The bond wire provides an electrically conductive connection by coupling the third electrically conductive layer at a second side surface of the second printed circuit board. Two or more printed circuit boards may be placed on two or more side surfaces of the carrier. At least two of the printed circuit boards may be electrically connected or coupled to each other by means of one or more bond wires which are coupled or bonded to side surfaces of the printed circuit boards. The carrier may for example be a cuboid and three printed circuit boards as described above are placed on three adjacent side surfaces of the cuboid. Each of the three printed circuit boards may in this arrangement be directly coupled by means of bond wires to each other printed surface board. The latter means that each printed circuit board is contacted at two different side surfaces to side surfaces of the other printed circuit boards.

The side surfaces of the carrier may be inclined at an angle different than 90°. Two of the side surfaces may have an angle of inclination of more than 90°. A first side of the carrier and a second side of the carrier may, for example, be inclined at an angle in the range between 105° and 165° or preferably between 120° and 150°. The angle of inclination may, for example, be 135°. The carrier may, for example, be a flat, four sided pyramid. One contacting circuit board may be placed on the flat top of the pyramid and four printed circuit boards may be placed on the sides of the four sided pyramid. The printed circuit board arrangement may be arranged such that the contacting circuit board and the printed circuit board are arranged on sides of the carrier such that coupling points of a bond wire for coupling the bond wire to the contacting circuit board and the printed circuit board are arranged in a plane. The contacting circuit board may be a printed circuit board as described above. The angle of inclination of the side surfaces of the printed circuit boards may be adapted to the angle of inclination of the side surfaces of the carrier such that the coupling points of the bond wire between the contacting circuit board and one printed circuit board are arranged in one plane. The contacting circuit board may in one approach, for example, not extend to the edge of the side of the carrier it is mounted on such that an edge of the side surface of the printed circuit board may touch the upper side of the contacting surface. The contacting circuit board may alternatively be a printed circuit board as described above and comprise an inclined side surface for coupling to bond wires. The angle of inclination of the two printed circuit boards and the side surfaces may be adapted to the angle of inclination of the side surface of the carrier such that the contacting areas for the bond wires at the side surfaces of the printed circuit board are arranged in one plane. The angle of inclination of the sides of the carrier may be, for example 135° and the angle of inclination of the printed circuit boards are both 157.5°. The angles of inclination of both circuit boards need not necessarily to be the same. The angle of inclination between the adjacent side surfaces of the carrier may be $\beta$. The angle of inclination of the first printed circuit board may be $\alpha 1$ and the angle of inclination of the second printed circuit board may be $\alpha 2$. The angles of inclination have in this case to fulfill the equation $$180° = \beta + (180° - \alpha 1) + (180° - \alpha 2)$$

in order to provide a flat plane for coupling the bond wires.

A method of fabricating a printed circuit board with a top side and a bottom side is described. The method comprises the steps of:
provding at least two electrically conductive layers for transmitting electrical current,
providing at least one electrically insulating layer comprising electrically insulating material,
arranging the electrically conductive layers and the electrically insulating layers in an alternating assembly such that the two electrically conductive layers are electrically insulated with respect to each other by means of the electrically insulating layers,
adapting each of the electrically conductive layers for coupling to a bond wire independently from the other electrically conductive layer at a side surface of the printed circuit board, said side surface being inclined with respect to the top side and the bottom side of the printed circuit board.

The side surfaces may, for example, be cut at an angle different than 90° in order to get an angle of inclination of more than 90°. An alternative approach would be to mill the printed surface board at the side surface in order to prepare a required angle of inclination.

According to a second aspect a method of fabricating a printed circuit board arrangement is provided. The method comprises the steps of
providing at least one printed circuit board as described above,
providing a carrier,
providing a contacting circuit board,
coupling the printed circuit board to a first side of the carrier,
coupling the contacting circuit board to a second side of the carrier being inclined to the first side of the carrier,
coupling at least one electrically conductive layer of the printed circuit board to a bond wire at the side surface of the printed circuit board, and
providing a connection to an electrically conductive trace of the contacting circuit board by means of the bond wire for exchanging electrical current between the printed circuit board and the contacting circuit board.

The printed surface board and the contacting circuit board may, for example be glued to the side surfaces of the carrier. The carrier may alternatively be made of electrically conductive material and one of the conductive layers of the printed circuit board may, for example, be soldered to the carrier in order to provide an electrically conductive connection between the carrier and the electrically conductive layer soldered to the carrier.

It shall be understood that the printed circuit board arrangement of claims 1-12 and the method of fabricating a printed circuit board arrangement according to claim 13 have similar and/or identical embodiments, in particular, as defined in the dependent claims.

It shall be understood that a preferred embodiment of the invention can also be any combination of the dependent claims with the respective independent claim.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings.

DETAILED DESCRIPTION OF EMBODIMENTS

Various embodiments of the invention will now be described by means of the Figures.

Figure 1:
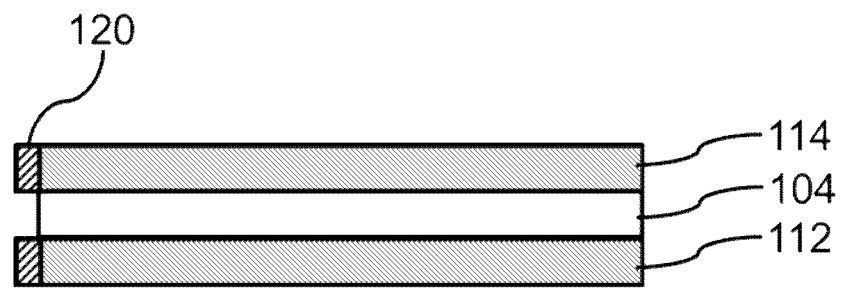
FIG. 1 shows a side view of a printed circuit board according to a first embodiment

FIG. 1 shows a side view of a printed circuit board according to a first embodiment. An electrically insulating layer 104 is sandwiched between two electrically conductive layers 112, 114. The thickness of the electrically conductive layers 112, 114 is not necessarily the same. The lower planar side of the electrically conductive layer 112 pointing away from the electrically insulating layer is the bottom side of the printed circuit board, and the upper planar side of the electrically conductive layer 114 pointing away from the electrically insulating layer 104 is the top side of the printed circuit board. The electrically conductive layers 112, 114 comprise at one side surface of the printed circuit board contacting areas which comprise in this case a coating 120 comprising gold for coupling the electrically conductive layers to bond wires. Each electrically conductive layer 112, 114 can be independently contacted by means of a bond wire. The side surface and the top side of the printed circuit board are inclined by an angle of 90°.

Figure 2:
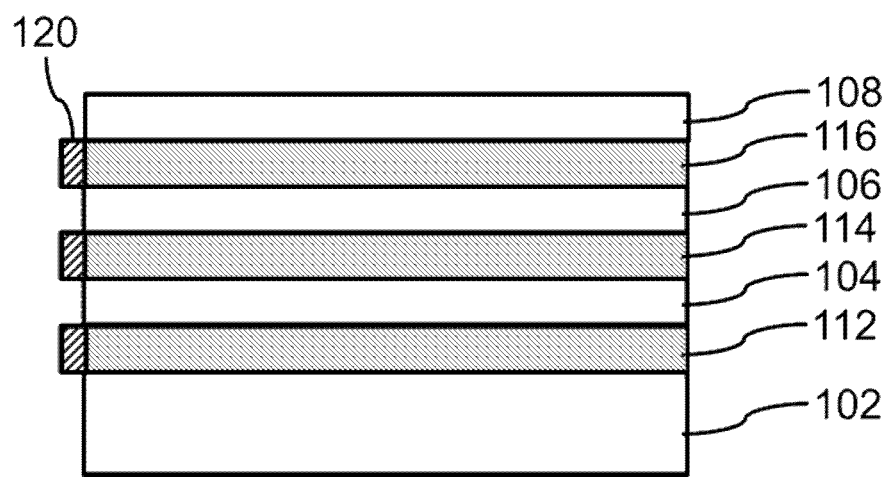
FIG. 2 shows a side view of a printed circuit board according to a second embodiment

FIG. 2 shows a side view of a printed circuit board according to a second embodiment. The printed circuit board according to the second embodiment comprises three electrically conductive layers 112, 114, 116 and four electrically insulating layers 102, 104, 106, 108 which are stacked in an alternating assembly such that in this case each electrically conductive layer 112, 114, 116 is sandwiched between two electrically insulating layers 102, 104, 106, 108. The lower planar side of the electrically insulating layer 102 pointing away from the electrically conductive layer 112 is the bottom side of the printed circuit board, and the upper planar side of the electrically insulating layer 108 pointing away from the electrically conductive layer 116 is the top side of the printed circuit board. The electrically conductive layers 112, 114, 116 comprise at one side surface of the printed circuit board contacting areas which comprise in this case a coating comprising gold for coupling each of the electrically conductive layers to bond wires. Each electrically conductive layer 112, 114, 116 can be independently contacted by means of a bond wire. The side surface and the top side of the printed circuit board are inclined by an angle of 90°.

Figure 3:
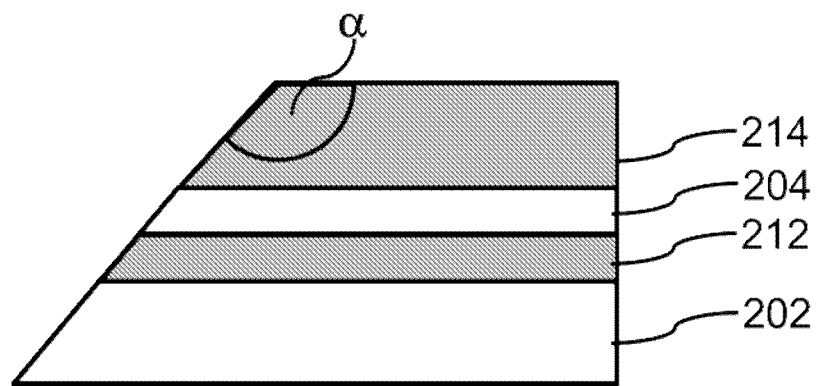
FIG. 3 shows a side view of a printed circuit board according to a third embodiment

FIG. 3 shows a side view of a printed circuit board according to a third embodiment. The printed circuit board according to the third embodiment comprises two electrically conductive layers 212, 214 and two electrically insulating layers 202, 204 which are stacked in an alternating assembly. The thickness of a first electrically conductive layer 212 is smaller than a thickness of a second electrically conductive layer 214. The thickness of a first electrically insulating layer 202 is bigger than a thickness of the second electrically insulating layer 204. The lower planar side of the electrically insulating layer 202 pointing away from the electrically conductive layer 212 is the bottom side of the printed circuit board, and the upper planar side of the electrically conductive layer 214 pointing away from the electrically insulating layer 204 is the top side of the printed circuit board. The side surface and the top side of the printed circuit board enclose an angle of inclination a of around 135°. The angle of inclination of around 135° increases an available contacting area of the first electrically conductive layer 212 having a thickness of 35 µm at the inclined side surface such that the thin first electrically conductive layer 212 can be coupled to a bond wire at the side surface. The bottom side of the printed circuit board is adapted to be coupled by means of gluing, soldering and the like to a carrier.

Figure 4:
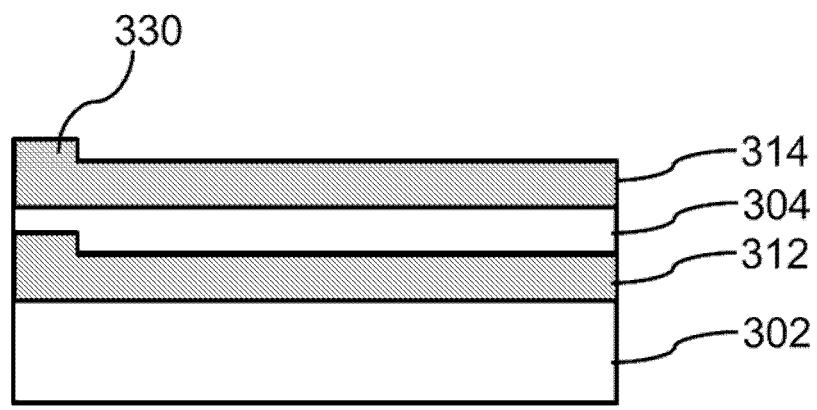
FIG. 4 shows a side view of a printed circuit board according to a fourth embodiment

FIG. 4 shows a side view of a printed circuit board according to a fourth embodiment. The printed circuit board according to the fourth embodiment comprises two electrically conductive layers 312, 314 and two electrically insulating layers 302, 304 which are stacked in an alternating assembly. The thickness of a first electrically insulating layer 302 is bigger than a thickness of the second electrically insulating layer 304. The lower planar side of the electrically insulating layer 302 pointing away from the electrically conductive layer 312 is the bottom side of the printed circuit board, and the upper side of the electrically conductive layer 314 pointing away from the electrically insulating layer 304 is the top side of the printed circuit board. The side surface and the top side of the printed circuit board enclose an angle of inclination a of around 90°. The electrically conductive layers 312, 314 have a thickness of 30 µm but are thickened at one side surface of the printed circuit board to 50 µm by means of a thickening 330. The thickening 330 enables coupling of the electrically conductive layers 312, 314 by means of a bond wire at the side surface of the printed circuit board with the thickening 330. The thickening has a depth of 50 µm parallel to the extension of the electrically conductive layers 312, 314.

Figure 5:
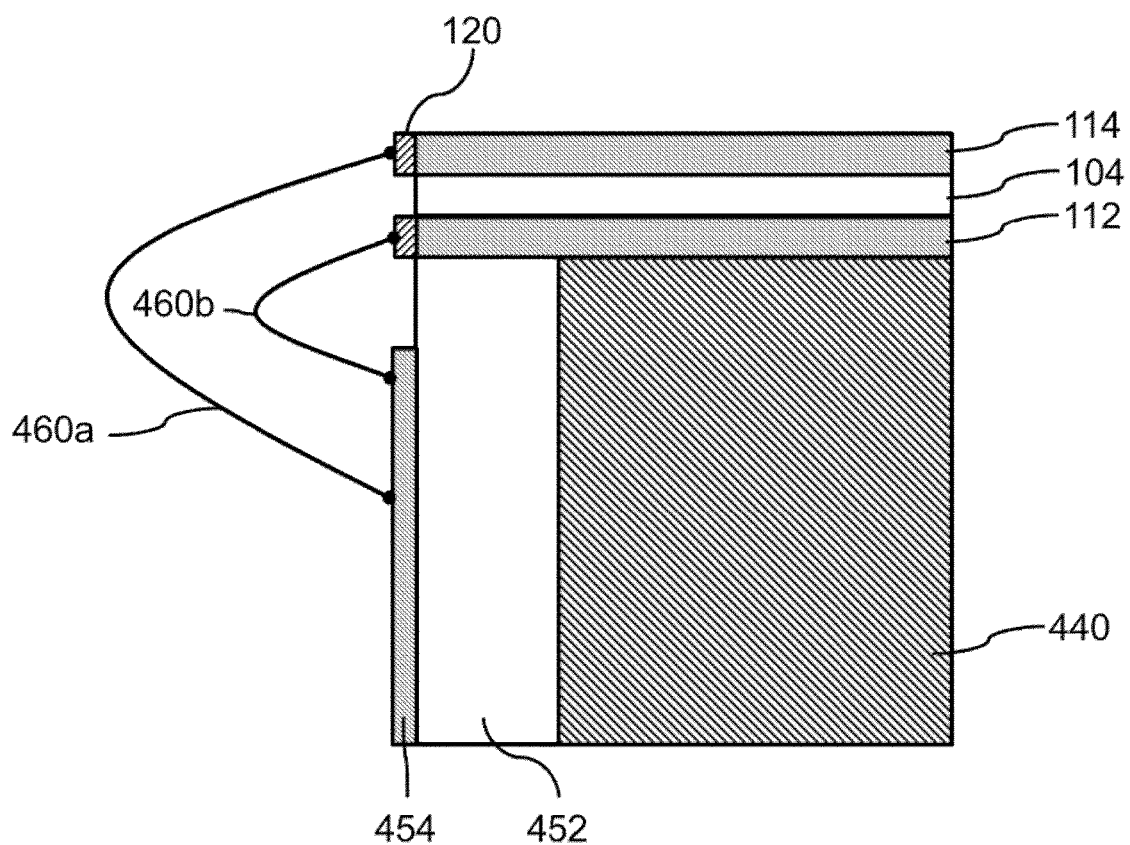
FIG. 5 shows a side view of a printed circuit board arrangement according to a first embodiment
Figure 6:
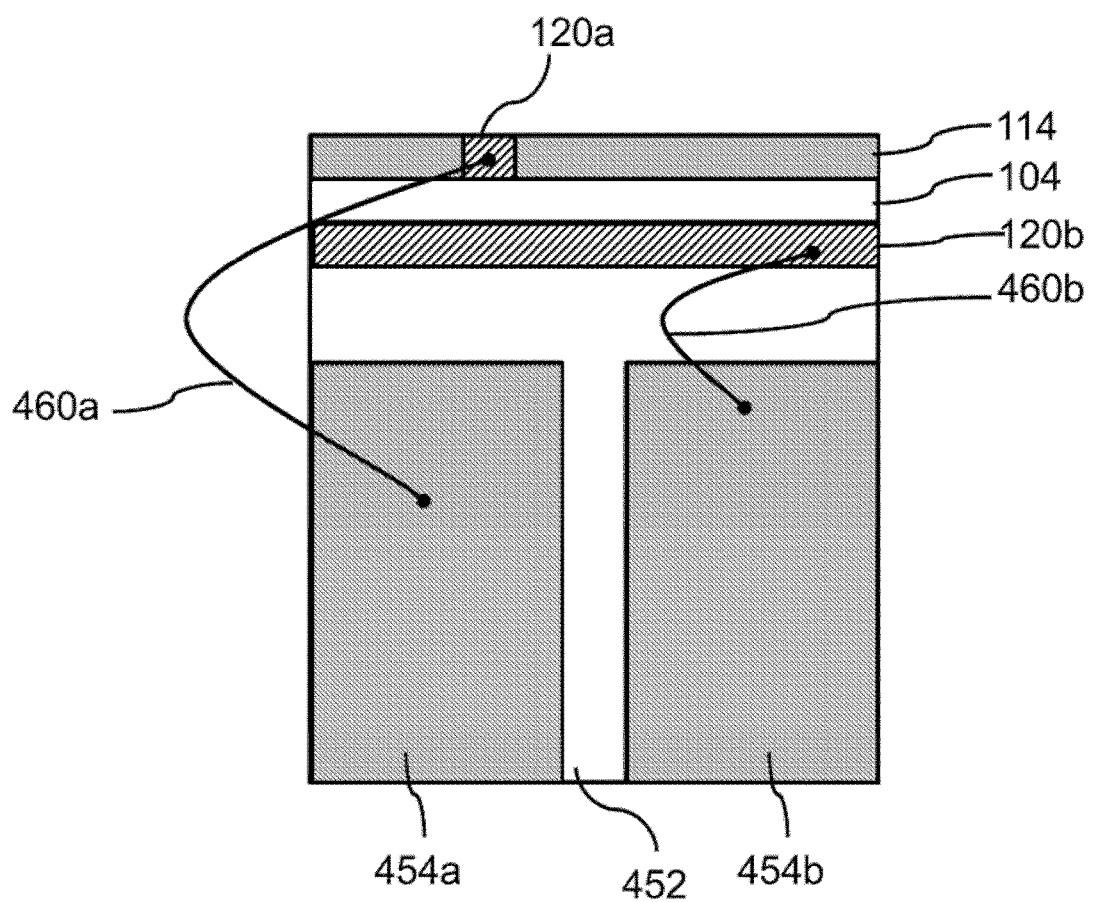
FIG. 6 shows a top view of the printed circuit board arrangement according to the first embodiment

FIG. 5 shows a side view of a printed circuit board arrangement according to a first embodiment and FIG. 6 shows a top view of the printed circuit board arrangement according to the first embodiment. The printed circuit board arrangement comprises a printed circuit board as shown in FIG. 1 and described above. The bottom side of the printed circuit board is glued to a first side of a cuboidal carrier 440 which is made of electrically insulating material. The glue is not shown in FIG. 5. A contacting circuit board comprises an electrically insulating base layer 452 which is glued to a second side of the carrier 440 which is adjacent to the first side of the carrier 440. An electrically conductive layer 454 of the contacting circuit board is provided on the side of the electrically insulating base layer 452 which is pointing away from the carrier. The electrically conductive layers 112, 114 comprise at a side surface of the printed circuit board which is arranged next to the contacting circuit board contacting areas which comprise a coating 120 comprising gold for coupling each electrically conductive layer 112, 114 to a bond wire 460a, 460b. The coating 120 provides contacting areas 120a, 120b on the electrically conductive layers 112, 114. Contacting area 120a covers only a part of the electrically conductive layer 114 at the side surface of the printed circuit board whereas electrically conductive layer 112 has a contacting area 120b which extends across the full width of the electrically conductive layer 112 exposed at the side surface of the printed circuit board. The electrically conductive layer 454 of the contacting circuit board comprises two electrically conductive traces 454a, 454b. The side surface of the printed circuit board and contacting circuit board are arranged at one edge of the cuboidal carrier 440 such that surfaces of the contacting areas 120a, 120b are arranged in a plane with the surfaces of the electrically conductive traces 454a, 454b. Electrically conductive trace 454a is electrically coupled to contacting area 120a by means of a first bond wire 460a, and electrically conductive trace 454b is electrically coupled to contacting area 120b by means of a second bond wire 460b. The bond wires 460a, 460b provide an electrically conductive connection between the respective electrically conductive structures in order to transmit electrical signals and/or electrical power.

Figure 7:
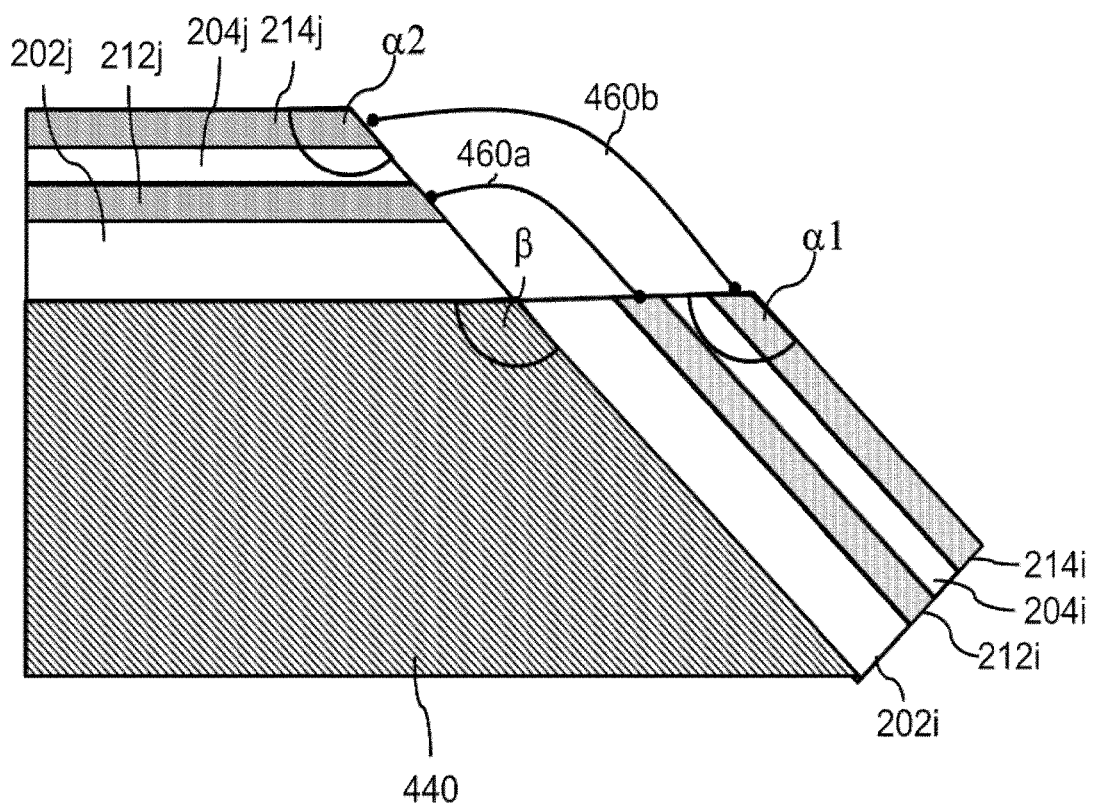
FIG. 7 shows a side view of a printed circuit board arrangement according to a second embodiment

FIG. 7 shows a side view of a printed circuit board arrangement according to a second embodiment. The printed circuit board arrangement comprises two printed circuit boards as shown in FIG. 3. The first printed circuit board comprises two electrically conductive layers 212i, 214i, and two electrically insulating layers 202i, 204i which are stacked in an alternating assembly. The second printed circuit board comprises two electrically conductive layers 212j, 214j, and two electrically insulating layers 202j, 204j which are stacked in an alternating assembly. The two printed circuit boards are coupled to two adjacent sides which build an edge of a carrier 440 being arranged as an active cooler for both printed circuit boards. The active cooler is made of metal with channels for providing a cooling liquid next to the surfaces of the cooler. The adjacent sides of the carrier 440 on which the printed circuit boards are placed enclose an angle of inclination of $\beta=140°$. The printed circuit boards are coupled to the carrier 440 with the bottom sides of the respective printed circuit board such that the side surfaces which enclose with the top surfaces of the printed circuit boards an angle of inclination of $\alpha1=130°$ and $\alpha2=130°$ oppose each other at the edge of the carrier such that the electrically conductive layer 212i of the first printed circuit board can be coupled by means of a first bond wire 460a to electrically conductive layer 212j of the second printed circuit board, and the electrically conductive layer 214i of the first printed circuit board can be coupled by means of a second bond wire 460b to electrically conductive layer 214j of the second printed circuit board. The bond wires 460a, 460b provide an electrically conductive connection between the respective electrically conductive structures in order to transmit electrical signals and/or electrical power. The coupling points of the bond wires 460a, 460b on the side surface of the first and the second printed circuit board are in this embodiment not arranged in a plane. Anyhow, the angles of inclination of the carrier β and the printed circuit boards α1, α2 can be adapted such that the coupling points are arranged in a plane. The channels or microchannels (not shown) of the active cooler or cooling device are arranged in parallel to and next to the surface on which the second printed circuit board is arranged. The cooling power provided at the surface next to the second printed circuit board enables a cooling of a first electrical heat source providing a heat density of 200 W/cm² taking into account e.g. the thermal properties of the second printed circuit board and the mounting technology used to mount the second printed circuit board (thermal resistance). The cooling power at the side on which the first printed circuit board is arranged enables only a cooling of a second electrical heat source providing a heat density with a maximum of 10 W/cm² taking into account e.g. the thermal properties of the first printed circuit board and the mounting technology used to mount the first printed circuit board (thermal resistance).

Figure 8:
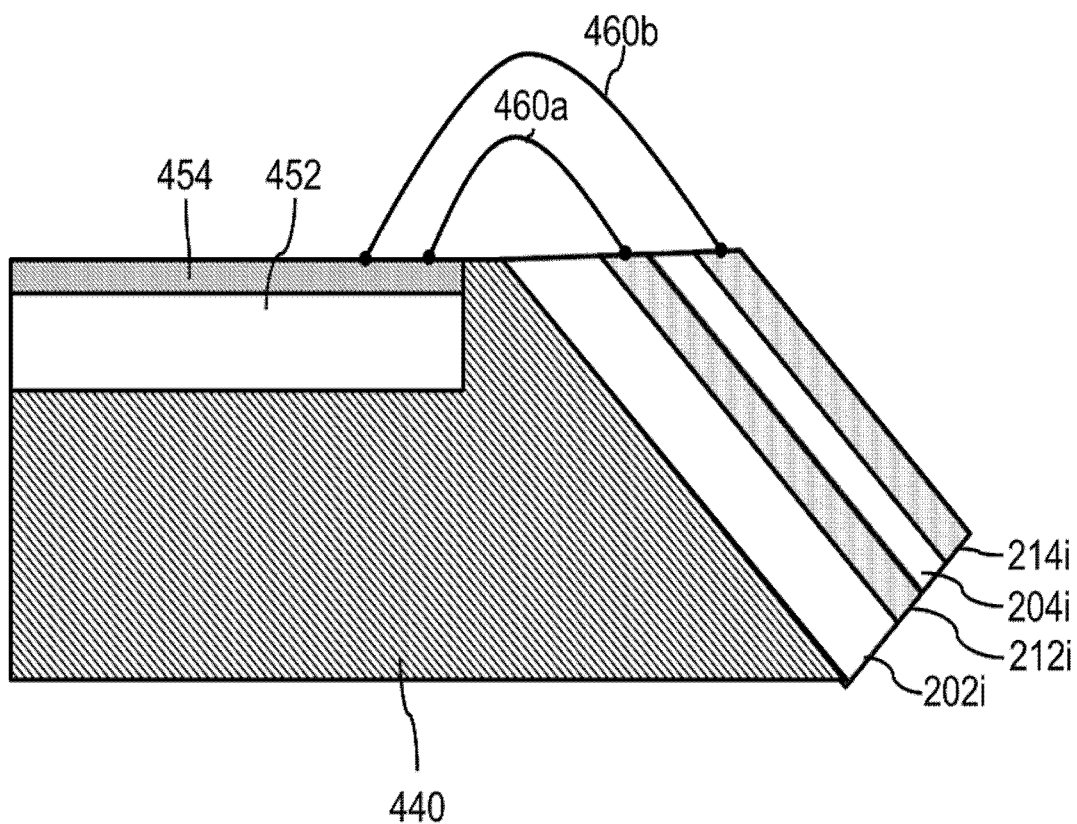
FIG. 8 shows a side view of a printed circuit board arrangement according to a third embodiment

FIG. 8 shows a side view of a printed circuit board arrangement according to a third embodiment. In addition to the adaption of the angles of inclination of the carrier, the contacting circuit board and the printed circuit board it is possible to arrange the surface of the carrier and/or the relative arrangement of the contacting circuit board and the one or more printed circuit boards such that the coupling points of the bond wires to the contacting circuit board and the respective printed circuit board are arranged in a plane. The printed circuit board arrangement comprises a printed circuit boards as shown in FIG. 3 and a contacting circuit board as shown in FIG. 5. The first printed circuit board comprises two electrically conductive layers 212*i*, 214*i*, and two electrically insulating layers 202*i*, 204*i* which are stacked in an alternating assembly. The contacting circuit board comprises an electrically insulating base layer 452 which is glued to a second side of the carrier 440 which is adjacent to the first side of the carrier 440. An electrically conductive layer 454 of the contacting circuit board is provided on the side of the electrically insulating base layer 452 which is pointing away from the carrier. The contacting circuit board is embedded in the carrier 440 such that the upper surface of the electrically conductive layer of the contacting circuit board 454 is at the same level as the surface of the carrier 440. The side of the carrier 440 on which the printed circuit board is placed and the side of the carrier on which the contacting circuit board is placed or embedded enclose an angle of inclination of 135°. The printed circuit board and the contacting circuit board are coupled to the carrier 440 with the bottom sides of the printed circuit board and the contacting circuit board. The side surface of the printed circuit board encloses with the top surface of the printed circuit board an angle of inclination of 135°. The side surface of the printed circuit board is arranged such that the contacting areas of the conductive layers 212*i*, 214*i* and the surface of the electrically conductive layer of the contacting circuit board 454 are arranged in one plane such that a coupling by means of wire bonds 460*a*, 460*b* can be performed in an easy way. The contacting circuit board has not necessarily to be embedded in the carrier 440. The contacting circuit board may, for example, not extend to the edge of the side of the carrier 440 it is mounted on and the side surface of the printed circuit board may be shifted on the respective side of the carrier 440 such that the coupling points of the bond wire are arranged in one plane. Both configurations enable to place two or more printed circuit boards on side surfaces of the carrier 440 (e.g. flat pyramid) such that all coupling points of the wire bonds are arranged in one plane.

Figure 9:
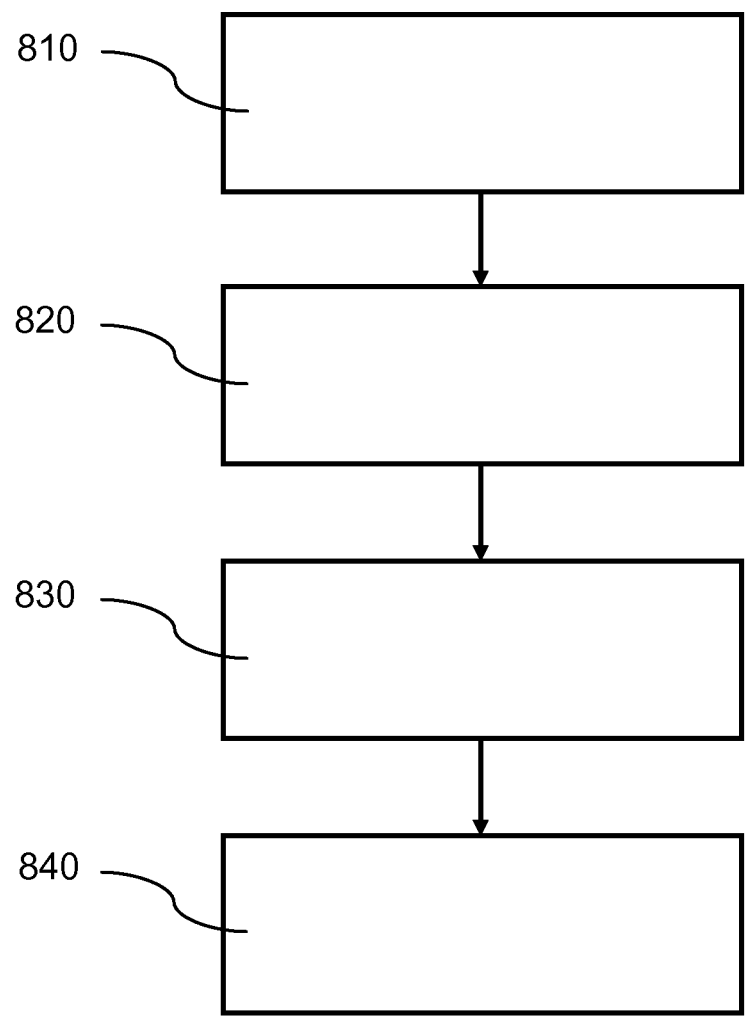
FIG. 9 shows a process flow of fabricating a printed circuit board

FIG. 9 shows a process flow of fabricating a printed circuit board. In step 810 are at least two electrically conductive layers for transmitting electrical signals provided. In step 820 is at least one electrically insulating layer comprising electrically insulating material provided. The electrically conducting layers and the electrically insulating layer are arranged in step 830 in an alternating assembly such that the two electrically conductive layers are electrically insulated with respect to each other by means of the electrically insulating layer. Each of the electrically conductive layers is adapted in step 840 for coupling to a bond wire independently from the other electrically conductive layer at a side surface of the printed circuit board being inclined to the top side and the bottom side of the printed circuit board. The processing steps have not necessarily to be performed in the order described above. The insulating layer may, for example be provided in a first step and the electrically conductive layers may be provided in a subsequent step.

Figure 10:
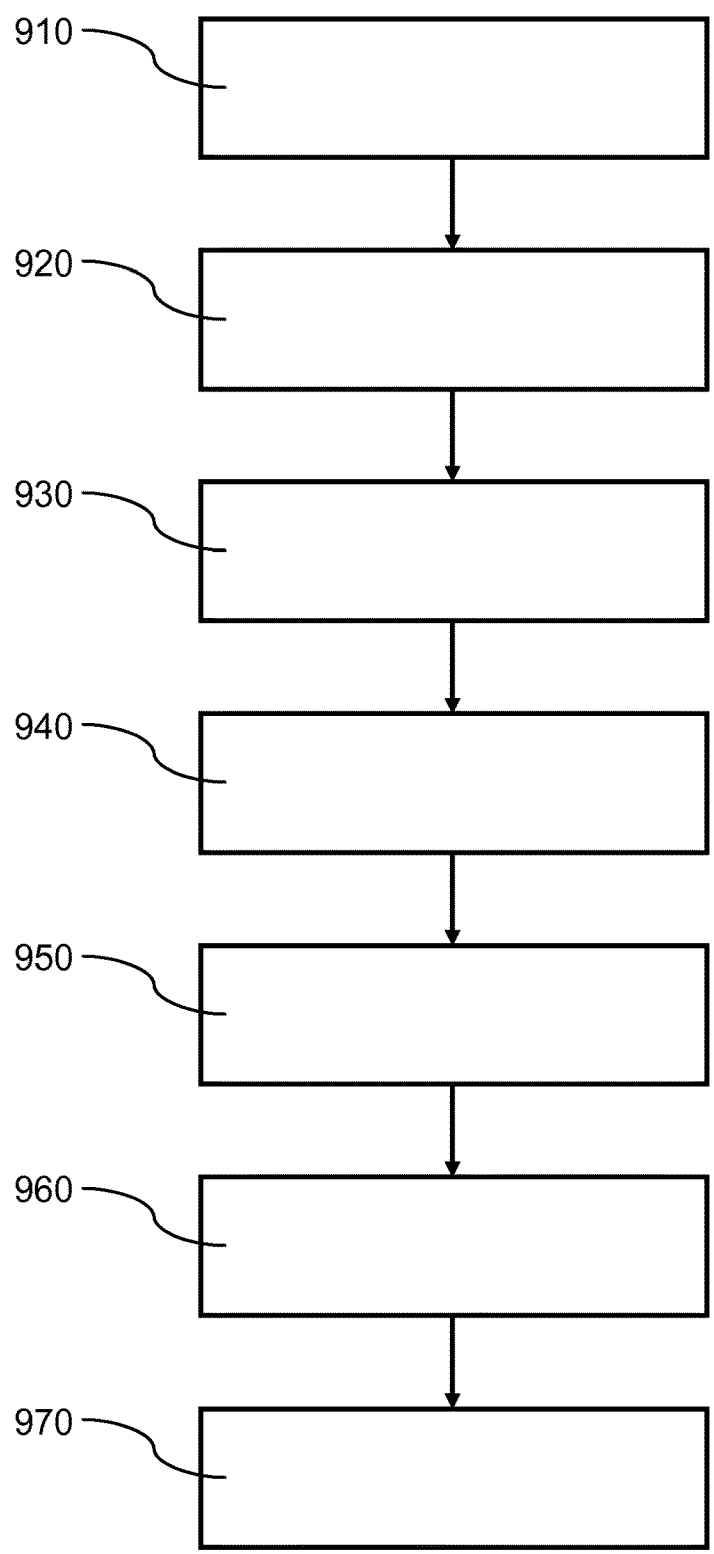
FIG. 10 shows a process flow of fabricating a printed circuit board arrangement In the Figures, like numbers refer to like objects throughout. Objects in the Figures are not necessarily drawn to scale.

FIG. 10 shows a process flow of fabricating a printed circuit board arrangement. At least one printed circuit board as described above is provided in step 910. A carrier is provided in step 920. A contacting circuit board is provided in step 930. The printed circuit board is coupled to a first side of the carrier in step 940. The contacting circuit board is coupled to a second side of the carrier being inclined to the first side of the carrier in step 950. At least one electrically conductive layer of the printed circuit board is coupled to a bond wire at the side surface of the printed circuit board in step 960. A connection to an electrically conducting trace of the contacting circuit board is provided by means of the bond wire for exchanging electrical signals between the printed circuit board and the contacting circuit board in step 970. The processing steps have not necessarily to be performed in the order described above. The carrier may, for example, be provided in the first step. Furthermore, it may be possible to provide two three or more contacting circuit boards.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS 102, 104, 106, 108 electrically insulating layer of printed circuit board
202, 204, 302, 304
202*i*, 204*i*, 202*j*, 204*j*
112, 114, 116 electrically conductive layers of printed circuit board
212, 214, 312, 314
212*i*, 214*i*, 212*j*, 214*j*
120 coating
120*a*, 120*b* contacting area
α, α1, α2 angle of inclination of printed circuit board
β angle of inclination of carrier
330 thickening
440 carrier
452 insulating base layer 454 electrically conductive layer of contacting circuit board
454a, 454b electrically conductive trace
460a, 460b bond wire
810 step of providing at least two electrically conductive layers
820 step of providing at least one electrically insulating layer
830 step of arranging the electrically conducting layers and the electrically insulating layer
840 step of adapting the electrically conductive layers
910 step of providing at least one printed circuit board
920 step of providing a carrier
930 step of providing a contacting circuit board
940 step of coupling printed circuit board to carrier
950 step of coupling contacting circuit board to carrier
960 step of coupling bond wire
970 step of providing electrically conductive connection

The invention claimed is:

1. A printed circuit board arrangement comprising:
at least one printed circuit board, the printed circuit board comprising:
a top side;
a bottom side;
at least two electrically conductive layers, wherein the at least two electrically conductive layers are arranged to transmit electrical current; and
at least one electrically insulating layer, the at least one electrically insulating layer comprising electrically insulating material,
a carrier; and
a contacting circuit board,
wherein the at least two electrically conductive layers and the at least one electrically insulating layer are arranged in an alternating assembly such that the at least two electrically conductive layers are electrically insulated with respect to each other using the at least one electrically insulating layer,
wherein each of the at least two electrically conductive layers is coupled to a bond wire independently from the other electrically conductive layer at a side surface of the printed circuit board,
wherein the side surface is inclined with respect to the top side of the printed circuit board,
wherein the printed circuit board is coupled to a first side of the carrier,
wherein the contacting circuit board is coupled to a second side of the carrier,
wherein the contacting circuit board is inclined to the first side of the carrier,
wherein the bond wire is arranged to provide a connection to an electrically conductive trace of the contacting circuit board,
wherein the bond is arranged to exchange electrical current between the printed circuit board and the contacting circuit board.

2. The printed circuit board arrangement according to claim 1, wherein each of the at least two electrically conductive layers have a thickness of at least 30 µm.

3. The printed circuit board arrangement according to claim 1,
wherein the at least one electrically insulating layer is sandwiched between the at least two electrically conductive layers,
wherein the at least one electrically insulating layer has a thickness of equal to or less than 200 µm.

4. The printed circuit board arrangement according to claim 1, wherein at least one electrically conductive layers comprise a thickening at the side of the printed circuit board such that the at least one electrically conductive layer is coupled to a bond wire independently from the other electrically conductive layers.

5. The printed circuit board arrangement according to claim 1, wherein the side surface is perpendicular to the top side and the bottom side of the printed circuit board.

6. The printed circuit board arrangement according to any one of claim 1, wherein the side surface is inclined to the top side of the printed circuit board such that a contact area for coupling the bond wire is increased.

7. The printed circuit board arrangement according to claim 1, wherein at least a portion of the at least two electrically conductive layers comprises a coating, wherein the coating compromises gold.

8. The printed circuit board arrangement according to claim 1,
wherein at least one of the at least two electrically conductive layers comprises electrically conductive paths,
wherein the electrically conductive paths are electrically insulated with respect to each other,
wherein a first electrically conductive path is electrically coupled by a first bond wire to a first contact pad of a first conductive trace of the contacting circuit board,
wherein a second electrically conductive path is electrically coupled by a second bond wire to the first contact pad.

9. The printed circuit board arrangement according to claim 1, wherein the carrier is arranged to dissipate heat.

10. The printed circuit board arrangement according to claim 9, wherein the carrier is arranged such that a first cooling power is provided at a first side of the carrier and second cooling power is provided at a second side of carrier.

11. The printed circuit board arrangement according to claim 1, wherein the first side of the carrier and the second side of the carrier are arranged perpendicular to each other.

12. The printed circuit board arrangement according to claim 1, wherein the printed circuit board is a first printed circuit board, wherein the contacting circuit board is a second printed circuit board, the second printed circuit board comprising:
a top side;
a bottom side;
at least two second electrically conductive layers, wherein the at least two second electrically conductive layers are arranged to transmit electrical current; and
at least one second electrically insulating layer, the at least one electrically insulating layer comprising electrically insulating material,
wherein the second electrically conductive layers and the second electrically insulating layer are arranged in an alternating assembly such that the two second electrically conductive layers are electrically insulated with respect to each other,
wherein each of the second electrically conductive layers is coupled to a bond wire independently from the other second electrically conductive layer at a side surface of the second printed circuit board,
wherein the side surface is inclined with respect to the top side of the second printed circuit board,
wherein the bond wire is arranged to provide an electrically conductive connection to a first conductive trace, wherein the first conductive trace is arranged as a third electrically conductive layer of the second printed circuit board by coupling the third electrically conductive layer at a second side surface of the second printed circuit board.

13. The printed circuit board arrangement according to claim 1 wherein the contacting circuit board and the printed circuit board are arranged on two sides of the carrier such that coupling points of a bond wire for coupling the bond wire to the contacting circuit board and the printed circuit board are arranged in a plane.

14. A method of fabricating a printed circuit board arrangement, the method comprising:
    providing at least one printed circuit board, the printed circuit board comprising:
        a top side;
        a bottom side;
        at least two electrically conductive layers, wherein the at least two electrically conductive layers are arranged to transmit electrical current; and
        at least one electrically insulating layer, the at least one electrically insulating layer comprising electrically insulating material,
        wherein the at least two electrically conductive layers and the at least one electrically insulating layer are arranged in an alternating assembly such that the at least two electrically conductive layers are electrically insulated with respect to each other using the at least one electrically insulating layer,
        wherein each of the at least two electrically conductive layers is coupled to a bond wire independently from the other electrically conductive layer at a side surface of the printed circuit board,
        wherein the side surface is inclined with respect to the top side of the printed circuit board,
    providing a carrier;
    providing a contacting circuit board;
    coupling the printed circuit board to a first side of the carrier;
    coupling the contacting circuit board to a second side of the carrier wherein the contacting circuit board is inclined to the first side of the carrier;
    coupling at least one electrically conductive layer of the printed circuit board to a bond wire at the side surface of the printed circuit board, and
    providing a connection to an electrically conductive trace of the contacting circuit board by means of the bond wire for exchanging electrical current between the printed circuit board and the contacting circuit board.

* * * * *